United States Patent
Li et al.

(10) Patent No.: US 10,985,120 B1
(45) Date of Patent: Apr. 20, 2021

(54) CHIP PACKAGING METHOD AND CHIP PACKAGING STRUCTURE

(71) Applicant: HANGZHOU JWL TECHNOLOGY INC., Zhejiang (CN)

(72) Inventors: Linping Li, Zhejiang (CN); Jinghao Sheng, Zhejiang (CN); Zhou Jiang, Zhejiang (CN)

(73) Assignee: JWL (ZHEJIANG) SEMICONDUCTOR CO., LTD.

( * ) Notice: Subject to any disclaimer, the term of this patent is extended or adjusted under 35 U.S.C. 154(b) by 0 days.

(21) Appl. No.: 17/036,035

(22) Filed: Sep. 29, 2020

(30) Foreign Application Priority Data

Oct. 15, 2019 (CN) .......................... 201910977524.9

(51) Int. Cl.
*H01L 21/768* (2006.01)
*H01L 23/00* (2006.01)
*H01L 21/78* (2006.01)

(52) U.S. Cl.
CPC ........ *H01L 24/03* (2013.01); *H01L 21/76802* (2013.01); *H01L 21/76877* (2013.01); *H01L 21/78* (2013.01); *H01L 24/11* (2013.01); *H01L 24/16* (2013.01); *H01L 24/27* (2013.01);
(Continued)

(58) Field of Classification Search
CPC ......... H01L 24/03; H01L 24/29; H01L 21/78; H01L 24/11; H01L 21/76802; H01L 24/27; H01L 24/94; H01L 24/16; H01L 24/83; H01L 21/76877; H01L 2224/0391
See application file for complete search history.

(56) References Cited

U.S. PATENT DOCUMENTS

| 8,426,233 B1 | 4/2013 | Lei et al. |
| 9,184,104 B1 * | 11/2015 | Chia ................... H01L 21/486 |
| 2004/0251525 A1 | 12/2004 | Zilber et al. |

(Continued)

FOREIGN PATENT DOCUMENTS

| CN | 103311138 A | 9/2013 |
| CN | 103779351 A | 5/2014 |

(Continued)

OTHER PUBLICATIONS

China National Intellectual Property Administration (CNIPA), Chinese Office Action issued in CN Application No. 201910977524.9 dated Apr. 3, 2020, pp. 1-11, including English translation.

(Continued)

*Primary Examiner* — Thanh T Nguyen
(74) *Attorney, Agent, or Firm* — The Belles Group, P.C.

(57) ABSTRACT

Provided are a chip packaging method and a chip packaging structure. The passivation layer is arranged on the pads of the wafer, then the first bonding layer is formed on the passivation layer, and the second bonding layer is formed on the substrate. The substrate and the wafer are bonded and packaged together by bonding the first bonding layer and the second bonding layer. The pads are only used as a conductive structure, not as a bonding layer due to the passivation layer arranged between the pads and the bonding layer. The through silicon via is arranged at the position above the pad and avoiding the bonding layer, so as to connect the functional circuit region between the wafer and the substrate to the outside of the chip packaging structure.

20 Claims, 7 Drawing Sheets

(52) U.S. Cl.
CPC .............. *H01L 24/29* (2013.01); *H01L 24/83* (2013.01); *H01L 24/94* (2013.01); *H01L 2224/0391* (2013.01)

(56) References Cited

U.S. PATENT DOCUMENTS

| | | |
|---|---|---|
| 2006/0211233 A1 | 9/2006 | Gan et al. |
| 2006/0228869 A1 | 10/2006 | Haluzak et al. |
| 2007/0099395 A1 | 5/2007 | Sridhar et al. |
| 2011/0147863 A1* | 6/2011 | Fujii .................. G01P 15/0802 257/418 |
| 2013/0234317 A1 | 9/2013 | Chen et al. |
| 2014/0264840 A1* | 9/2014 | Lin ...................... H01L 21/563 257/737 |
| 2016/0049384 A1* | 2/2016 | Lu ........................ H01L 23/562 257/737 |
| 2016/0329298 A1 | 11/2016 | Lee et al. |
| 2017/0062273 A1* | 3/2017 | Zhu .................... H01L 23/5386 |
| 2018/0277527 A1 | 9/2018 | Yota et al. |

FOREIGN PATENT DOCUMENTS

| | | |
|---|---|---|
| CN | 108511409 A | 9/2018 |
| CN | 110690165 | 1/2020 |
| JP | 2009515338 | 4/2009 |

OTHER PUBLICATIONS

European Search Report issued in European Application No. 20199847.3 dated Feb. 23, 2021.

\* cited by examiner

CHIP PACKAGING METHOD AND CHIP PACKAGING STRUCTURE

This application claims the priority to Chinese Patent Application No. 201910977524.9, titled "CHIP PACKAGING METHOD AND CHIP PACKAGING STRUCTURE," filed on Oct. 15, 2019 with the China National Intellectual Property Administration (CNIPA), the content of which is incorporated herein by reference.

TECHNICAL FIELD

The present disclosure relates to the technical field in fabricating semiconductor devices, and in particular to a chip packaging method and a chip packaging structure.

BACKGROUND

Wafer bonding process is commonly used in packaging a semiconductor chip, and two wafers are bonded together with bonding materials. In conventional technology, various methods are used to connect functional circuits on the bonded wafers to the outside, thus realizing signal transmission.

Figure 1:
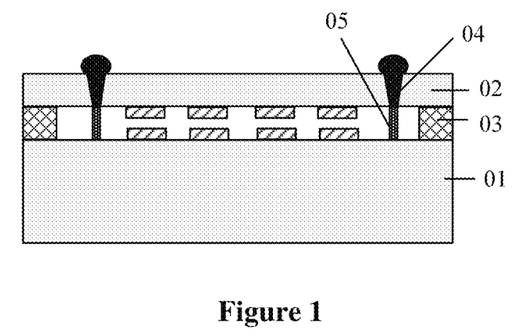
FIG. 1 is a schematic diagram of a chip packaging structure according to the conventional technology.

With the decrease of the volume of semiconductor devices, Through Silicon Vias (TSV) technology has gradually become a mainstream technology. Reference is made to FIG. 1, which is a schematic diagram of a chip packaging structure with a surface acoustic wave filter formed by TSV in the conventional technology. In FIG. 1, a wafer 01 and a packaging substrate 02 are bonded together by bonding glue 03, and the circuit inside the structure is connected to outside of the chip by filling the conductive material 04 and the copper pillar 05 in the TSV, and then a ball is mounted to form a complete filter chip.

However, with the decreases of the volume of the chip, the size of the circuit in the above structure is also required to be reduced, resulting in not ensuring the circuit performance

SUMMARY

In view of this, a chip packaging method and a chip packaging structure are provided in the present disclosure, to solve the problem in the conventional technology that the size of the circuit inside the chip is required to be reduced with the decreases of the volume of the chip, resulting in not ensuring the circuit performance.

To achieve the above objectives, the technical solutions provided in the present disclosure are as follows.

A chip packaging method includes:

providing a wafer, where the wafer has a first surface and a second surface which are opposite to each other, and at least two functional circuit regions and multiple pads around the functional circuit regions are formed on the first surface of the wafer;

forming a passivation layer on the pads;

forming a first bonding layer on the passivation layer;

providing a substrate, where the substrate has a third surface and a fourth surface which are opposite to each other, and a second bonding layer is formed on the third surface of the substrate;

bonding the first bonding layer and the second bonding layer, so that the third surface and a surface of the passivation layer away from the wafer are attached together;

thinning the substrate to obtain a thinned substrate;

making a via-hole, where the via-hole at least sequentially penetrates the substrate and the passivation layer to expose the pads;

filling the via-hole; and cutting along an area between adjacent pads, to form multiple chip packaging structures.

In an embodiment, the forming the first bonding layer on the passivation layer includes:

forming a first groove on the passivation layer; and filling the first groove by an embedded process to form the first bonding layer, where a surface of the first bonding layer away from the passivation layer is aligned with a surface of the passivation layer away from the pads.

In an embodiment, after the forming the first bonding layer, the method further includes:

planarizing the surface of the first bonding layer and the surface of the passivation layer, so that the surface of the first bonding layer is aligned with the surface of the passivation layer.

In an embodiment, the providing a substrate includes:

providing a substrate base, where the substrate base has the third surface and the fourth surface which are opposite to each other;

forming a second groove on the third surface; and filling the second groove by the embedded process to form the second bonding layer, where a surface of the second bonding layer away from the substrate is aligned with the third surface.

In an embodiment, the method further includes:

forming a third groove on the third surface, where the third groove is arranged in opposite to the functional circuit regions on the wafer after bonding.

In an embodiment, after the forming the second bonding layer, the method further includes:

planarizing the surface of the second bonding layer and the surface of the substrate base, so that the surface of the second bonding layer is aligned with the surface of the substrate base.

In an embodiment, the making the via-hole includes:

etching, from a surface of the thinned substrate away from the third surface, the substrate, the second bonding layer and the passivation layer sequentially by an etching process to expose the pads and form the via-hole.

In an embodiment, the making the via-hole includes:

etching, from a surface of the thinned substrate away from the third surface, the substrate, the second bonding layer, the first bonding layer and the passivation layer sequentially by an etching process, to expose the pads and form the via-hole.

In an embodiment, the method further includes:

mounting a ball above the filled via-hole.

In an embodiment, a material of the first bonding layer and a material of the second bonding layer are the same and are both metal materials.

In an embodiment, a material of the first bonding layer includes copper, gold or copper-tin alloy.

A chip packaging structure is further provided in the present disclosure, where the chip packaging structure is formed by any one of the chip packaging methods described above, and the chip packaging structure includes:

a wafer and a substrate which are arranged opposite to each other;

a functional circuit region and a pad both arranged on a surface of the wafer facing towards the substrate, where the pad is arranged around the functional circuit region;

a passivation layer arranged on the pad and attached to a surface of the substrate;

a first bonding layer arranged on a surface of the passivation layer away from the wafer;

a second bonding layer arranged on a surface of the substrate facing towards the wafer, where a bonding interface is formed between the first bonding layer and the second bonding layer; and a conductive structure arranged in the substrate, where the conductive structure at least penetrates the substrate and the passivation layer, and is electrically connected with the pad.

In an embodiment, the chip packaging structure further includes a ball mounting above the conductive structure.

In an embodiment, a thickness of the first bonding layer ranges from 100 nm to 1000 nm, inclusive.

In an embodiment, a thickness of the passivation layer ranges from 1 μm to 5 μm, inclusive.

In an embodiment, a material of the passivation layer includes Si, amorphous AlN, $Si_3N_4$ or silicon oxide.

In an embodiment, a material of the first bonding layer and a material of the second bonding layer are the same.

In an embodiment, a material of the first bonding layer includes copper, gold or copper-tin alloy.

In an embodiment, a thickness of the second bonding layer ranges from 1 μm to 5 μm, inclusive.

In an embodiment, a thickness of the substrate ranges from 30 μm to 100 μm, inclusive.

In an embodiment, the chip packaging structure further includes: a third groove arranged, on a surface of the substrate facing towards the wafer, in an area corresponding to the functional circuit region.

In an embodiment, the chip packaging structure is a chip having a filter, and the functional circuit region corresponding to the filter is a resonant circuit.

In an embodiment, the substrate has a wafer structure, and the wafer structure includes:

a first surface and a second surface which are opposite to each other, where at least two second functional circuit regions and multiple second pads around the second functional circuit regions are formed on the first surface; and a second passivation layer formed on the second pads, where the second bonding layer is arranged on a surface of the second passivation layer away from the second pads.

It can be seen from the technical solution above, in the chip packaging method according to the present disclosure, the passivation layer is arranged on the pad of the wafer, then the first bonding layer is formed on the passivation layer, and the second bonding layer is formed on the substrate, then the substrate and the wafer are bonded and packaged together by bonding the first bonding layer and the second bonding layer. The pad is only used as a conductive structure, not as a bonding layer due to the passivation layer arranged between the pad and the bonding layer. Thus the TSV is arranged at the position above the pad and avoiding the bonding layer, to connect the functional circuit region between the wafer and the substrate to the outside of the chip packaging structure. That is, the TSV is arranged above the pad without arranging a copper pillar that occupies the area of the functional circuit region, so that the use area of the functional circuit region is increased. When the size of the chip is decreased, the area of the functional circuit region may not be reduced, thus ensuring the circuit performance of the chip.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION

As described in the background technology, a circuit structure in a chip packaging structure according to the conventional technology is reduced with reduction of the size of the chip, thus the circuit performance may not be guaranteed.

The inventor found that the reason for the above phenomenon is that, as shown in FIG. 1, in order to connect the circuit structure to the outside of the chip, a copper pillar 05 is required to be arranged between a wafer 01 and a package substrate 02, and then a through silicon via 04 is formed above the copper pillar 05. As a result, the arrangement of the copper pillar 05 occupies a part of spaces of the circuit structure, and the circuit structure is required to be reduced with the decreases of the size of the chip, thus a short circuit risk of the reduced circuit structure may increase, and the circuit performance may not meet requirements.

Based on this, a chip packaging method is provided in the present disclosure, and the method includes:

providing a wafer, where the wafer has a first surface and a second surface which are opposite to each other, and at least two functional circuit regions and multiple pads around the functional circuit regions are formed on the first surface of the wafer;

forming a passivation layer on the pads;

forming a first bonding layer on the passivation layer;

providing a substrate, where the substrate has a third surface and a fourth surface which are opposite to each other, and a second bonding layer is formed on the third surface of the substrate;

bonding the first bonding layer and the second bonding layer, so that the third surface and a surface of the passivation layer away from the wafer are attached together;

thinning the substrate to obtain a thinned substrate;

making a via-hole, where the via-hole at least sequentially penetrates the substrate and the passivation layer to expose the pads;

filling the via-hole; and cutting along an area between adjacent pads, to form multiple chip packaging structures.

In the chip packaging method according to the present disclosure, the passivation layer is arranged on the pad of the wafer, then the first bonding layer is formed on the passivation layer, and the second bonding layer is formed on the substrate, then the substrate and the wafer are bonded and packaged together by bonding the first bonding layer and the second bonding layer. The pad is only used as a conductive structure, not as a bonding layer due to the passivation layer arranged between the pad and the bonding layer. Thus the TSV is arranged at the position above the pad and avoiding the bonding layer, to connect the functional circuit region between the wafer and the substrate to the outside of the chip packaging structure. That is, the TSV is arranged above the pad without arranging a copper pillar that occupies the area of the functional circuit region, so that the use area of the functional circuit region is increased. When the size of the chip is decreased, the area of the functional circuit region may not be reduced, thus ensuring the circuit performance of the chip.

Moreover, in the chip packaging method according to the present disclosure, the bonding between the wafer and the substrate is realized by the bonding layer, and the reliability of the chip is improved due to greater force of a metal bonding.

Hereinafter, the technical solutions according to an embodiment of the present disclosure are described clearly and completely in conjunction with the drawings. It is apparent that the embodiments in the following description are only some embodiments of the technical solution of the present disclosure, rather than all of the embodiments. Based on the embodiment of the present disclosure, other embodiments obtained by those skilled in the art without any creative work all fall within the scope of protection of the present disclosure.

Figure 2:
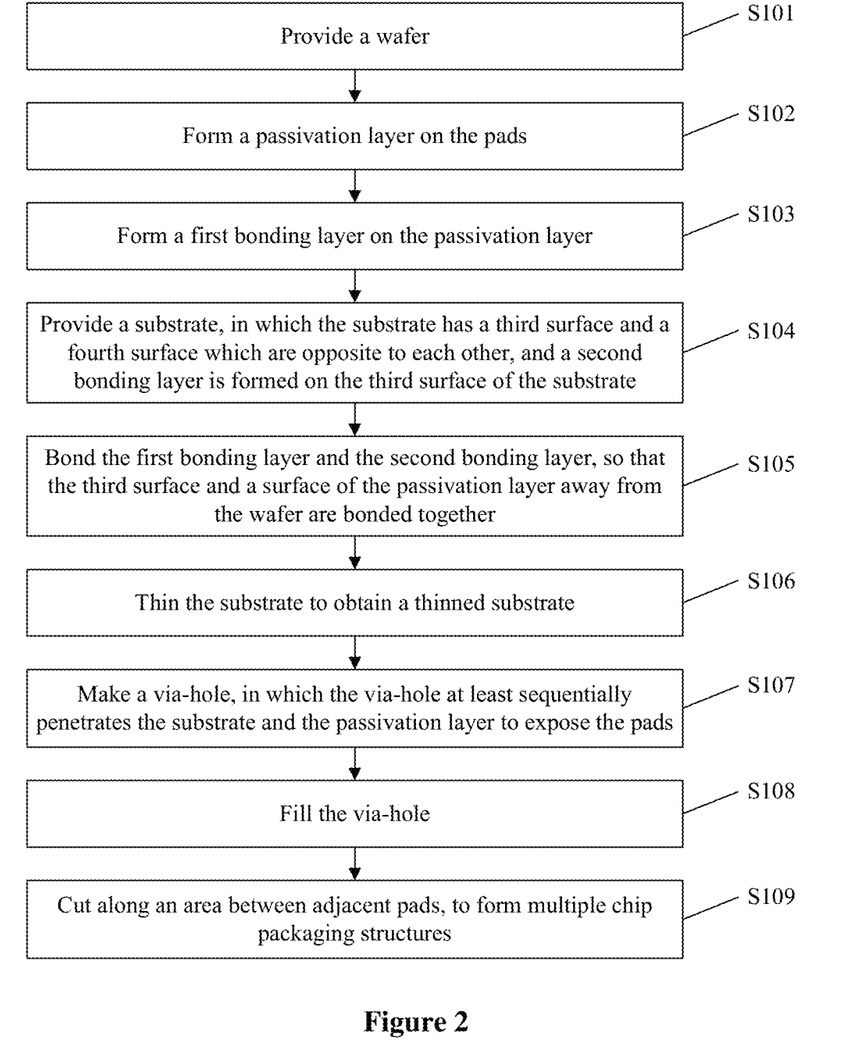
FIG. 2 is a flow chart of a chip packaging method according to an embodiment of the present disclosure.

Reference is made to FIG. 2, which is a flow chart of a chip packaging method according to an embodiment of the present disclosure, and the chip packaging method includes steps S101 to S109.

In step S101, a wafer is provided, where the wafer has a first surface and a second surface which are opposite to each other, and at least two functional circuit regions and multiple pads around the functional circuit regions are formed on the first surface of the wafer.

It should be noted that the specific type of the chip is not limited in the embodiment of the present disclosure. A filter chip is taken as an example for description. The filter chip is designed by the principle of surface acoustic wave or bulk acoustic wave. When packaging the filter chip, an air cavity without contacting with any medium is required to be formed at a side of a resonant circuit unit, to ensure that the sound wave may not be conducted and dissipated, and the sound wave is resonant according to the design mode to obtain the required frequency output. Therefore, an air cavity is needed at a side of the resonant unit when all filter chips are packaged.

Figure 3:
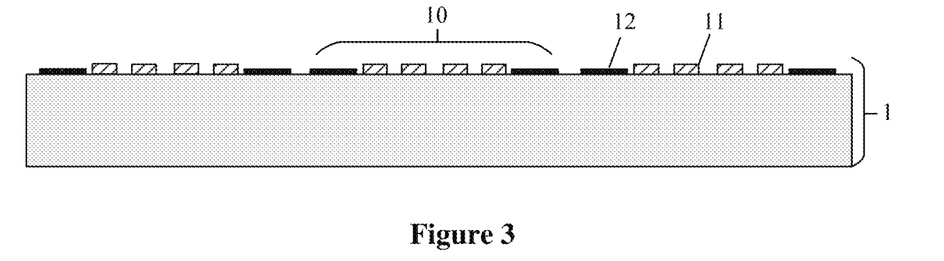
FIGS. 3 to 13 are process diagrams corresponding to a chip packaging method according to an embodiment of the present disclosure.

Reference is made to FIG. 3, which is a schematic sectional structural diagram of a wafer. The wafer has a first surface and a second surface which are opposite to each other, where the first surface is the upper surface in FIG. 3, and the second surface is the lower surface in FIG. 3, which are not shown by numeral references in the embodiment. The resonant circuit 11 with a filter and the pads 12 are formed on the first surface of the wafer 1. It should be noted that, before the wafer is cut, the filter units 10 are usually arranged in an array on the wafer for mass production. Each of the filter units 10 includes the resonant circuit 11 and the pads 12.

In the embodiment, the functional circuit region corresponding to the filter chip is a resonant circuit. In other embodiments, according to the different design on chip functions, the circuit structure in the functional circuit region may be different.

In step S102, a passivation layer is formed on the pads.

Figure 4:
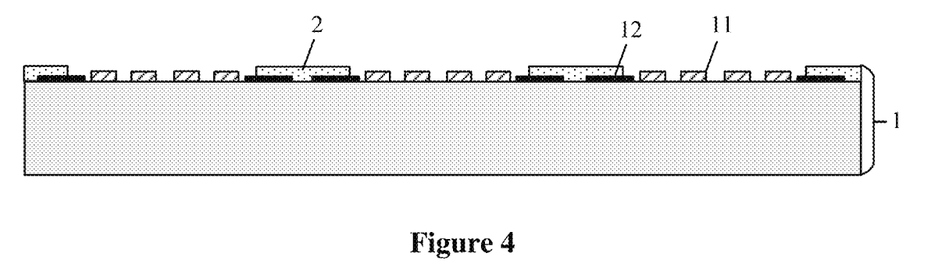

As shown in FIG. 4, the passivation layer 2 is formed on the pads 12. It should be noted that the passivation layer 2 only needs to cover part of the pads to realize passivation and insulation. The specific position of the passivation layer is not limited in the embodiment. The process for forming the passivation layer in the embodiment may be a deposition process, and the passivation layer is deposited on the surface of the pads. The material of the passivation layer may be one of Si, amorphous AlN, $Si_3N_4$ or silicon oxide. In order to facilitate the deposition of the passivation layer, the passivation layer formed on the pads between two adjacent functional circuit regions may be connected into one region, to facilitate the production of the passivation layer.

In the embodiment, the specific thickness of the passivation layer is not limited, and different thickness may be determined according to the different chip structures. It should be noted that, taken the filter chip as an example, since the resonant circuit of the filter chip is required to be arranged in the cavity, a thickness of the cavity may be controlled by the thickness of the passivation layer in the embodiment. In the embodiment, optionally, the thickness of the passivation layer ranges from 1 μm to 5 μm, inclusive.

In step S103, a first bonding layer is formed on the passivation layer.

It should be noted that the specific method of forming the first bonding layer is not limited in the embodiment, as long as ensuring that the surface of the substrate is attached to the surface of the passivation layer after the first bonding layer and the second bonding layer are bonded.

Figure 5:
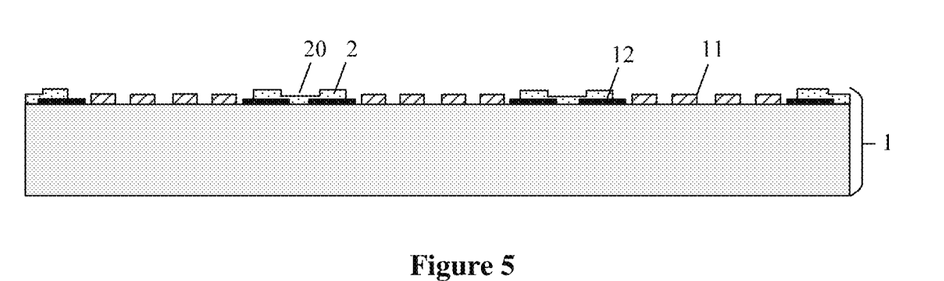

Referring to FIG. 5, in the embodiment, the first bonding layer is formed on the passivation layer 2 by the following methods.

A first groove 20 is formed on the passivation layer 2. The position of the first groove is not limited in the embodiment, and may be designed according to the preset bonding position.

Figure 6:
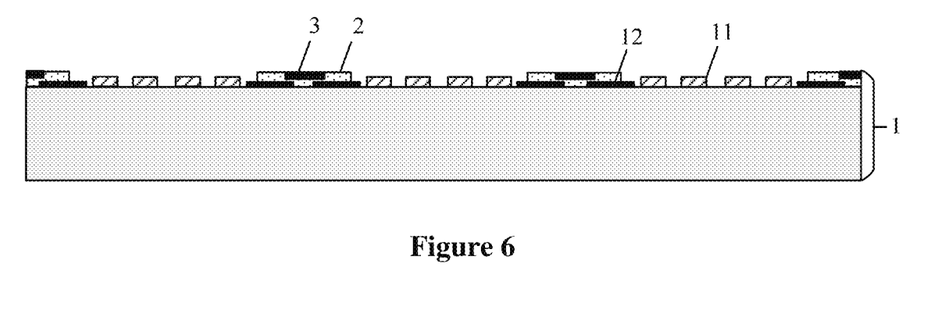

As shown in FIG. 6, the first groove 20 is filled by an embedded process to form the first bonding layer 3. A surface of the first bonding layer 3 away from the passivation layer 2 is aligned with a surface of the passivation layer 2 away from the pads 12. That is, as shown in FIG. 6, the upper surface of the first bonding layer 3 is aligned with the upper surface of the passivation layer 2.

The embedded process is used to embed the material of the first bonding layer in the first groove, so that the surface of the first bonding layer is aligned with the surface of the passivation layer.

In order to make the bonding between the first bonding layer and the second bonding layer more firm, the chip packaging method according to an embodiment may also include: planarizing the surface of the first bonding layer and the surface of the passivation layer, so that the surface of the first bonding layer is aligned with the surface of the passivation layer.

In the embodiment, optionally, the first bonding layer is formed by an evaporation plating process.

It should be noted that, in order to ensure the passivation effect of the passivation layer, the bottom of the first groove needs to be above the pads, and the passivation layer remains between the first bonding layer and the pads. In the embodiment, optionally, the thickness of the first bonding layer ranges from 100 nm to 1000 nm, inclusive.

In step S104, a substrate is provided. The substrate has a third surface and a fourth surface which are opposite to each other, and a second bonding layer is formed on the third surface of the substrate.

In an embodiment, the substrate is provided as follows.

a substrate base is provided, where the substrate base has the third surface and the fourth surface which are opposite to each other.

Figure 7:
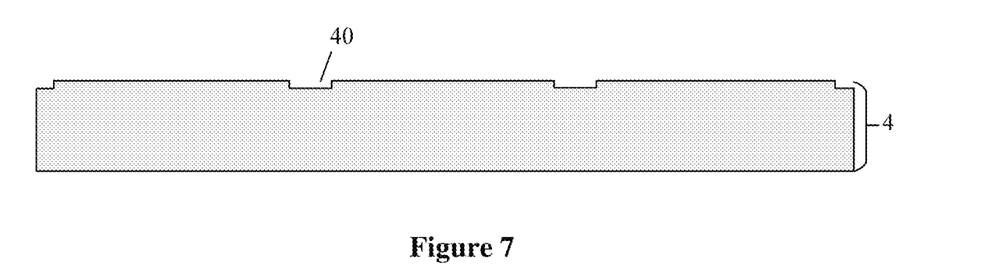

As shown in FIG. 7, a second groove 40 is formed on the third surface of the substrate 4.

Figure 8:
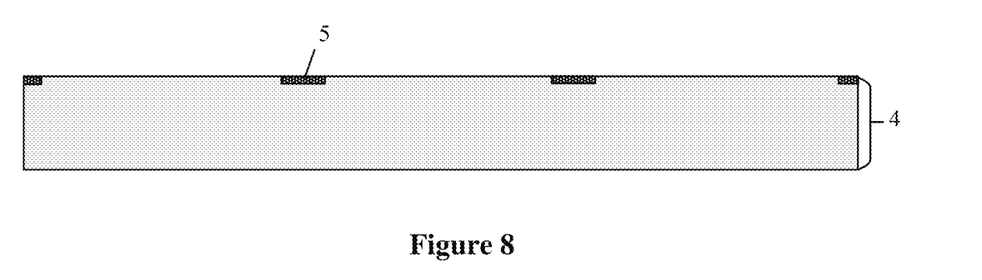

As shown in FIG. 8, the second groove 40 is filled by the embedded process to form the second bonding layer 5, and a surface of the second bonding layer 5 away from the substrate 4 is aligned with the third surface. That is, as shown in FIG. 8, the upper surface of the second bonding layer 5 is aligned with the upper surface of the substrate 4.

In the embodiment, a positioned of the second bonding layer 5 is set based on a position of the first bonding layer 3.

Moreover, in order to ensure that the third surface of the substrate is attached to the surface of the passivation layer after the first bonding layer and the second bonding layer are bonded, the chip packaging method further includes: the surface of the second bonding layer and the surface of the substrate base are planarized, so that the surface of the second bonding layer is aligned with the surface of the substrate base.

It should be noted that, in forming the cavity of the filter chip, in addition to controlling the thickness of the passivation layer to control the thickness of the cavity, the chip packaging method may further include: a third groove is formed on the third surface, where the third groove is arranged in opposite to the functional circuit region on the wafer after bonding.

The filter chip with larger cavity thickness is formed by arranging the third groove. In the embodiment, the shape of the third groove is not limited. In the sectional view perpendicular to the third surface, the third groove may be a square groove or an arc-shaped groove, which is not limited in the embodiment.

In step S105, the first bonding layer is bonded with the second bonding layer, so that the third surface is attached to the surface of the passivation layer away from the wafer.

Figure 9:
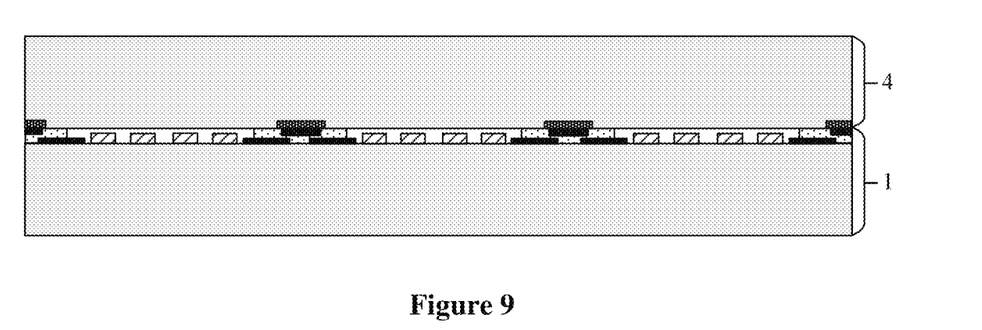

As shown in FIG. 9, the first bonding layer and the second bonding layer are bonded together by a bonding process, and the surface of the passivation layer is closely attached to the surface of the substrate.

In the embodiment, the material of the first bonding layer and the material of the second bonding layer are not limited. Optionally, the material of the first bonding layer and the material of the second bonding layer are the same, and both are metal material. In the embodiment, the metal material is used for bonding to form a metal bonding, which is more stable than other bonding structures formed by bonding glue, so that the chip packaging structure has high reliability. In the embodiment, optionally, the material of the first bonding layer includes copper, gold or copper-tin alloy.

In the embodiment of the present disclosure, the projection areas of the first bonding layer and the second bonding layer on the wafer are not limited, and specific positions of the first bonding layer and the second bonding layer are also not limited, as long as the wafer and the substrate can be bonded together after the first bonding layer and the second bonding layer are bonded, thus to ensure the reliability of the chip.

In step S106, the substrate is thinned to obtain a thinned substrate.

Figure 10:
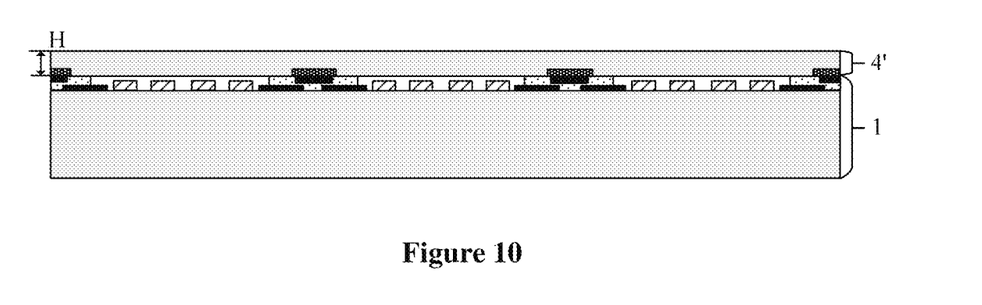

As shown in FIG. 10, the substrate is thinned to prepare for subsequent manufacture of a via-hole. Therefore, a thickness of the thinned substrate 4' needs to meet the requirement of the via-hole. In the embodiment, the specific thickness of the thinned substrate is not limited. In order to facilitate subsequent manufacture of the via-hole and meet the requirements of reliability of the chip, optionally, the thickness H of the thinned substrate ranges from 30 μm to 100 μm, inclusive.

In step S107, the via-hole is made, where the via-hole at least sequentially penetrates the substrate and the passivation layer to expose the pads.

Figure 11:
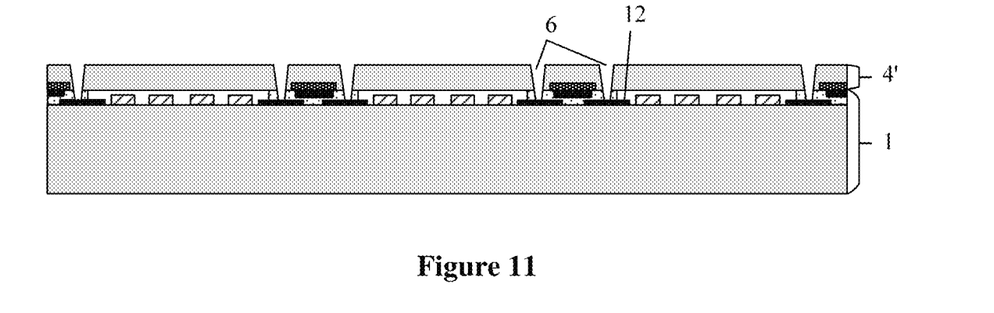

As shown in FIG. 11, the substrate base and the passivation layer are sequentially etched from a thinned surface of the substrate, to form the via-hole 6, which exposes the pads 12.

It should be noted that in the embodiment, the via-hole may only penetrate the substrate and the passivation layer without contacting the first bonding layer and the second bonding layer. Alternatively, the sidewall of the via-hole contacts with the first bonding layer alone, or contacts with the second bonding layer alone, or contacts with both the first bonding layer and the second bonding layer, which is not limited in the embodiment.

It should be noted that, the substrate, the second bonding layer and the passivation layer are sequentially etched from the surface of the thinned substrate away from the third surface by an etching process, to expose the pads and form the via-hole.

Figure 12:
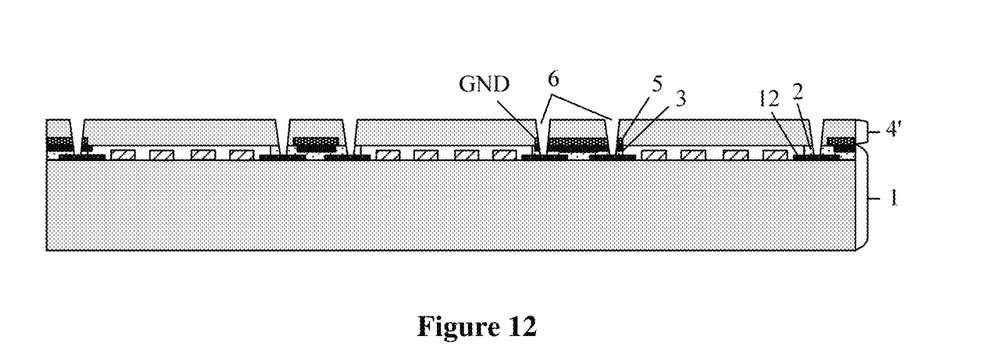

In other embodiments of the present disclosure, if an internal structure of the circuit needs to connect to ground, in the embodiment, also as shown in FIG. 12, the substrate 4', the second bonding layer 5, the first bonding layer 3 and the passivation layer 2 may be sequentially etched from the surface of the thinned substrate 4' away from the third surface by the etching process, to expose the pads 12 and form the via-hole. That is, after the via-hole is filled subsequently, the metal in the via-hole is electrically connected with the metal of the first bonding layer and the second bonding layer, thus to realize grounding.

Alternatively, when the via-hole is made, only the substrate, the second bonding layer and the passivation layer are penetrated; or when the via-hole is made, only the substrate, the first bonding layer and the passivation layer are penetrated, which is not limited in the embodiment, as long as a metal bonding layer may be also used as a grounding ring when the grounding needs to be provided, thereby further saving space of the chip.

In step S108, the via-hole is filled.

The via-hole is filled with a conductive material to form a conductive structure 7, thus to electrically connect the pads on the wafer with the outside. In the embodiment, in order to form a chip structure which can be directly electrically connected with other components, after filling the via-hole to form the conductive structure, the chip packaging method further includes: a ball is mounted above the filled via-hole, where the ball is electrically connected with the conductive structure, referring to FIG. 13.

In step S109, the wafer is cut along an area between the adjacent pads, to form multiple chip packaging structures.

Figure 13:
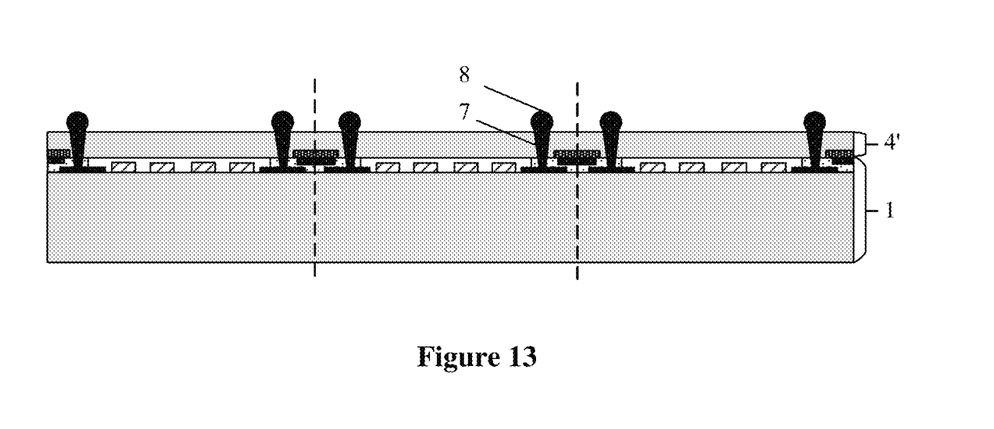
Figure 14:
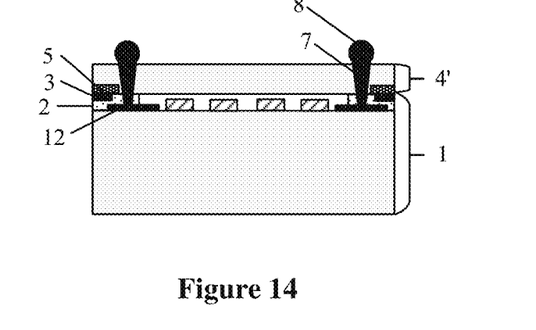
FIG. 14 is a schematic diagram of a chip packaging structure according to an embodiment of the present disclosure.

Referring to a dotted line in FIG. 13, the dotted line is a wafer cutting line, and multiple individual chip packaging structures are formed by cutting the wafer. FIG. 14 is a schematic diagram of a chip packaging structure according to the embodiment of the present disclosure.

In the chip packaging method according to the present disclosure, the passivation layer is arranged on the pads of the wafer, then the first bonding layer is formed on the passivation layer, and the second bonding layer is formed on the substrate, then the substrate and the wafer are bonded and packaged together by bonding the first bonding layer and the second bonding layer. The pads are only used as a conductive structure, not as a bonding layer due to the passivation layer arranged between the pads and the bonding layer. Thus the TSV is arranged at the position above the pads and avoiding the bonding layer, to connect the functional circuit regions between the wafer and the substrate to the outside of the chip packaging structure. That is, the TSV is arranged above the pad without arranging a copper pillar that occupies the area of the functional circuit region, so that the use area of the functional circuit region is increased. When the size of the chip is decreased, the area of the functional circuit region may not be reduced, thus ensuring the circuit performance of the chip.

Moreover, in a case that the material of the bonding layer is a metal material, the reliability of the chip is improved due to greater force of a metal bonding.

Based on the same inventive concept, a chip packaging structure is further provided in the present disclosure, where the chip packaging structure is made by the chip packaging method described above. Referring to FIG. 14, the chip packaging structure includes:

a wafer 1 and a substrate 4' which are opposite to each other;

a functional circuit region and a pad 12 around the functional circuit region, which are arranged on a surface of the wafer 1 facing towards the substrate 4';

a passivation layer 2 arranged on the pad 12 and attached to a surface of the substrate 4';

a first bonding layer 3 arranged on a surface of the passivation layer 2 away from the wafer 1;

a second bonding layer 5 arranged on a surface of the substrate 4' facing towards the wafer 1, where a bonding interface is formed between the first bonding layer 3 and the second bonding layer 5; and a conductive structure 7 arranged in the substrate 4', where the conductive structure at least penetrates the substrate 4' and the passivation layer 2, and is electrically connected with the pad 12.

In order to facilitate the subsequent direct usage of the chip, a ball 8 may be mounted above the conductive structure in the embodiment.

The parameters and the materials of each structure are not limited in the embodiment of the present disclosure. Optionally, the thickness of the first bonding layer ranges from 100 nm to 1000 nm, inclusive. Optionally, the thickness of the passivation layer ranges from 1 μm to 5 μm, inclusive. The material of the passivation layer includes Si, amorphous AlN, $Si_3N_4$ or silicon oxide. The material of the first bonding layer and the material of the second bonding layer are the same. The material of the first bonding layer includes copper, gold or copper-tin alloy. The thickness of the second bonding layer ranges from 1 μm to 5 μm, inclusive. The thickness of the substrate ranges from 30 μm to 100 μm, inclusive.

Figure 15:
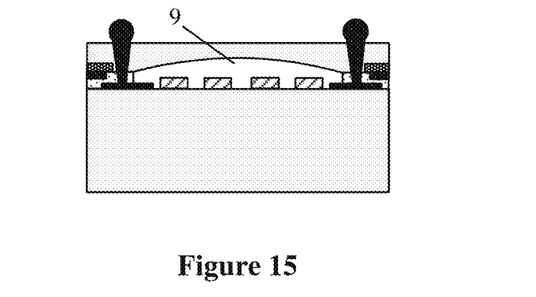
FIG. 15 is a schematic diagram of a chip packaging structure according to another embodiment of the present disclosure.

In a case that the chip structure is a filter chip, a third groove 9 is further arranged, on a surface of the substrate facing towards the wafer, in an area corresponding to the functional circuit region. As shown in FIG. 15, the third groove corresponding to the resonant circuit is arranged on the substrate, and the third groove may be an arc-shaped groove or a square groove, which is not limited in the embodiment. As shown in FIG. 15, the third groove is an arc-shaped groove.

Figure 16:
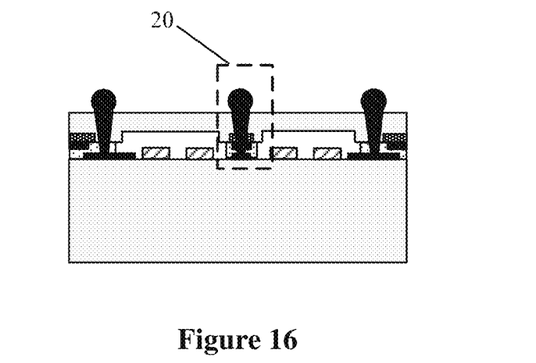
FIG. 16 is a schematic diagram of a chip packaging structure according to another embodiment of the present disclosure.

In addition, when a signal in the resonant circuit needs to be connected to the outside of the chip, a TSV may be arranged in the middle of the chip. The arrangement structure is the same as that in a bonding region (that is, the first bonding layer, the second bonding layer and the region where the TSV is located). As shown in FIG. 16, the bonding structure 20 includes the pad on the wafer, the passivation layer on the pad, the first bonding layer and the second bonding layer on the passivation layer, and the TSV which sequentially penetrates the substrate, the second bonding layer, the first bonding layer and the passivation layer to expose the pad.

Figure 17:
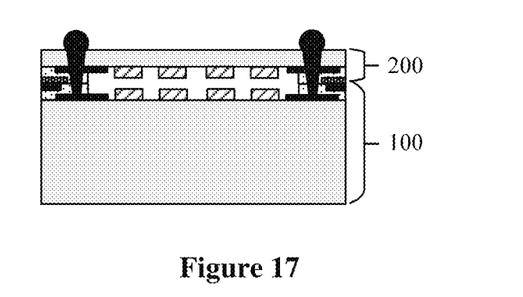
FIG. 17 is a schematic diagram of a chip packaging structure according to still another embodiment of the present disclosure.

In the embodiment, the substrate may also be another wafer. For convenience of description, the another wafer is referred to as a second wafer in the embodiment. The second wafer also has a first surface and a second surface which are opposite to each other, where at least two second functional circuit regions and multiple second pads around the second functional circuit regions are formed on the first surface. The functional circuit regions of two bonded wafers are arranged oppositely, and the pads of the two bonded wafers are also arranged oppositely. Further, a second passivation layer is arranged on the second pads, and the second bonding layer is arranged on a surface of the second passivation layer away from the second pads. As shown in FIG. 17, the first wafer 100 and the second wafer 200 are bonded together.

The second bonding layer is arranged on the surface of the passivation layer. After two wafers are bonded, the passivation layers of the two wafers are closely attached with each other, so as to facilitate subsequent manufacture of the via-hole.

It should be noted that, multiple structures of the chip packaging structure may be further provided based on the inventive concept of the present disclosure, which are not described in detail in the embodiment of the present disclosure.

In addition, multiple wafer structures with filters may also be packaged at the same time by the chip packaging method according to the embodiment of the present disclosure, thus to form a packaging structure with multiple filters, including a filter product (e.g., a two-in-one, three-in-one, and four-in-one filter product) and a multiplexer product (e.g., a duplexer, a quadruplexer, a hexaplexer, and a octaplexer), which directly achieves the minimum product structure and optimal performance.

The chip packaging structure according to the embodiment of the present disclosure, by using the chip packaging method described in the above embodiment, can directly utilize the existing technology and equipment, and has mature materials, which is suitable for packaging all filter types (all types of SAW and BAW), and also suitable for packaging a single filter or multiple filters, and also suitable for packaging a RF front end module (SIP module) including filters for various cellular terminals. The cellular terminals include 2G/3G/4G/5G mobile phone, Wi-Fi, Pad, smart watch, IOT, car and other terminal devices in terminal scenes.

The chip packaging structure according to the embodiment of the present disclosure is obtained by the chip packaging method described in the above embodiment. The passivation layer is arranged on the pad of the wafer, then the first bonding layer is formed on the passivation layer, and the second bonding layer is formed on the substrate, then the substrate and the wafer are bonded and packaged together by bonding the first bonding layer and the second bonding layer. The pad is only used as a conductive structure, not as a bonding layer due to the passivation layer arranged between the pad and the bonding layer. Thus the TSV is arranged at the position above the pad and avoiding the bonding layer, to connect the functional circuit region between the wafer and the substrate to the outside of the chip packaging structure. That is, the TSV is arranged above the pad without arranging a copper pillar that occupies the area of the functional circuit region, so that the use area of the functional circuit region is increased. When the size of the chip is decreased, the area of the functional circuit region may not be reduced, thus ensuring the circuit performance of the chip.

It should be noted that, the embodiments in this specification are described in a progressive way, each of which emphasizes the differences from others, and the same or similar parts among the embodiments can be referred to each other.

It should be further noted that, the relational terms such as first, second or the like are only used herein to distinguish one entity or operation from another entity or operation, rather than requiring or implying that the actual relationship or order exists between the entities or operations. Furthermore, terms of "include", "comprise" or any other variants are intended to be non-exclusive. Therefore, an item or device including a series of elements includes not only these elements, but also other elements that are not explicitly listed, or further includes elements inherent to such item or device. Unless expressively limited otherwise, an element defined by a statement "comprising (including) a . . . " does not exclude other same element that may exist in the item or device including such element.

The above illustration of the disclosed embodiments enables those skilled in the art to implement or practice the present disclosure. Many changes to these embodiments are apparent for those skilled in the art, and general principles defined herein can be implemented in other embodiments without departing the spirit or scope of the present disclosure. Hence, the present disclosure is not limited to the embodiments disclosed herein, but is to conform to the widest scope consistent with principles and novel features disclosed herein.

The invention claimed is:

1. A chip packaging method, comprising:
providing a wafer, wherein the wafer has a first surface and a second surface which are opposite to each other, and at least two functional circuit regions and a plurality of pads around the functional circuit regions are formed on the first surface of the wafer;
forming a passivation layer on the pads;
forming a first bonding layer on the passivation layer;
providing a substrate, wherein the substrate has a third surface and a fourth surface which are opposite to each other, and a second bonding layer is formed on the third surface of the substrate;
bonding the first bonding layer and the second bonding layer, so that the third surface and a surface of the passivation layer away from the wafer are attached together;
thinning the substrate to obtain a thinned substrate;
making a via-hole, wherein the via-hole at least sequentially penetrates the substrate and the passivation layer to expose the pads;
filling the via-hole; and
cutting along an area between adjacent pads, to form a plurality of chip packaging structures.

2. The chip packaging method according to claim 1, wherein the forming the first bonding layer on the passivation layer comprises:
forming a first groove on the passivation layer; and
filling the first groove by an embedded process to form the first bonding layer, wherein a surface of the first bonding layer away from the passivation layer is aligned with a surface of the passivation layer away from the pads.

3. The chip packaging method according to claim 2, wherein after the forming the first bonding layer, the method further comprises:
planarizing the surface of the first bonding layer and the surface of the passivation layer, so that the surface of the first bonding layer is aligned with the surface of the passivation layer.

4. The chip packaging method according to claim 2, wherein the providing a substrate comprises:
providing a substrate base, wherein the substrate base has the third surface and the fourth surface which are opposite to each other;
forming a second groove on the third surface; and
filling the second groove by the embedded process to form the second bonding layer, wherein a surface of the second bonding layer away from the substrate is aligned with the third surface.

5. The chip packaging method according to claim 4, further comprising:
forming a third groove on the third surface, wherein the third groove is arranged in opposite to the functional circuit regions on the wafer after bonding.

6. The chip packaging method according to claim 4, wherein after the forming the second bonding layer, the method further comprises:
planarizing the surface of the second bonding layer and the surface of the substrate base, so that the surface of the second bonding layer is aligned with the surface of the substrate base.

7. The chip packaging method according to claim 1, wherein the making the via-hole comprises:
etching, from a surface of the thinned substrate away from the third surface, the substrate, the second bonding layer and the passivation layer sequentially by an etching process to expose the pads and form the via-hole.

8. The chip packaging method according to claim 1, wherein the making the via-hole comprises:
etching, from a surface of the thinned substrate away from the third surface, the substrate, the second bonding layer, the first bonding layer and the passivation layer sequentially by an etching process, to expose the pads and form the via-hole.

9. The chip packaging method according to claim 1, further comprising:
mounting a ball above the filled via-hole.

10. The chip packaging method according to claim 1, wherein a material of the first bonding layer and a material of the second bonding layer are the same and are both metal materials.

11. The chip packaging method according to claim 10, wherein a material of the first bonding layer comprises copper, gold or copper-tin alloy.

12. A chip packaging structure, wherein the chip packaging structure is formed by the chip packaging method according to claim 1, and the chip packaging structure comprises:

a wafer and a substrate which are arranged opposite to each other;

a functional circuit region and a pad both arranged on a surface of the wafer facing towards the substrate, wherein the pad is arranged around the functional circuit region;

a passivation layer arranged on the pad and attached to a surface of the substrate;

a first bonding layer arranged on a surface of the passivation layer away from the wafer;

a second bonding layer arranged on a surface of the substrate facing towards the wafer, wherein a bonding interface is formed between the first bonding layer and the second bonding layer; and a conductive structure arranged in the substrate, wherein the conductive structure at least penetrates the substrate and the passivation layer, and is electrically connected with the pad.

13. The chip packaging structure according to claim 12, further comprising a ball mounting above the conductive structure.

14. The chip packaging structure according to claim 12, wherein a thickness of the passivation layer ranges from 1 µm to 5 µm, inclusive.

15. The chip packaging structure according to claim 12, wherein a material of the passivation layer comprises Si, amorphous AlN, $Si_3N_4$ or silicon oxide.

16. The chip packaging structure according to claim 12, wherein a material of the first bonding layer and a material of the second bonding layer are the same.

17. The chip packaging structure according to claim 12, wherein a material of the first bonding layer comprises copper, gold or copper-tin alloy.

18. The chip packaging structure according to claim 12, further comprising: a third groove arranged, on a surface of the substrate facing towards the wafer, in an area corresponding to the functional circuit region.

19. The chip packaging structure according to claim 18, wherein the chip packaging structure is a chip having a filter, and the functional circuit region corresponding to the filter is a resonant circuit.

20. The chip packaging structure according to claim 12, wherein the substrate has a wafer structure, and the wafer structure comprises:

a first surface and a second surface which are opposite to each other, wherein at least two second functional circuit regions and a plurality of second pads around the second functional circuit regions are formed on the first surface; and a second passivation layer formed on the second pads, wherein the second bonding layer is arranged on a surface of the second passivation layer away from the second pads.

* * * * *